(12) United States Patent
Tailliet et al.

(10) Patent No.: US 10,275,173 B2
(45) Date of Patent: *Apr. 30, 2019

(54) NON-VOLATILE MEMORY DEVICE HAVING A MEMORY SIZE

(71) Applicant: STMicroelectronics (Rousset) SAS, Rousset (FR)

(72) Inventors: François Tailliet, Fuveau (FR); Marc Battista, Marseilles (FR)

(73) Assignee: STMICROELECTRONICS (ROUSSET) SAS, Rousset (FR)

(*) Notice: Subject to any disclaimer, the term of this patent is extended or adjusted under 35 U.S.C. 154(b) by 0 days.

This patent is subject to a terminal disclaimer.

(21) Appl. No.: 15/672,475

(22) Filed: Aug. 9, 2017

(65) Prior Publication Data

US 2017/0337007 A1    Nov. 23, 2017

Related U.S. Application Data

(63) Continuation of application No. 15/053,950, filed on Feb. 25, 2016, now Pat. No. 9,753,665.

(30) Foreign Application Priority Data

Sep. 25, 2015   (FR) ..................... 15 59042

(51) Int. Cl.
G06F 3/06 (2006.01)
G11C 5/06 (2006.01)
(Continued)

(52) U.S. Cl.
CPC .......... G06F 3/0634 (2013.01); G06F 3/0604 (2013.01); G06F 3/0644 (2013.01);
(Continued)

(58) Field of Classification Search
None
See application file for complete search history.

(56) References Cited

U.S. PATENT DOCUMENTS

| | | |
|---|---|---|
| 5,490,118 A | 2/1996 | Nishioka et al. |
| 7,408,808 B2 | 8/2008 | Roohparvar |

(Continued)

FOREIGN PATENT DOCUMENTS

| | | |
|---|---|---|
| WO | 2008067658 A1 | 6/2008 |
| WO | 2010076600 A1 | 7/2010 |

OTHER PUBLICATIONS

"Doubling the DDR3 memory capacity to 8 Gigabit," Intelligent Memory, Technical White Paper, http://www.intelligentmemory.com/fileadmin/download/WP_IM_doubling_DDR3.pdf, 3 pages, retrieved Nov. 29, 2015.
(Continued)

*Primary Examiner* — Kevin Verbrugge
(74) *Attorney, Agent, or Firm* — Slater Matsil, LLP

(57) ABSTRACT

A memory device includes an input/output interface, a bus of SPI type coupled to the input/output interface, and a plurality of individual non-volatile memory devices connected to the bus of SPI type. The chip select inputs of each individual memory device are all connected to one and the same chip select wire of the SPI bus. The individual memory devices are further configured and controllable so as to behave, as seen by the input/output interface, as a single non-volatile memory device, the total memory space of which has a total memory capacity equal to the sum of the individual memory capacities of the individual devices.

21 Claims, 17 Drawing Sheets

(51) Int. Cl.
*G11C 7/10* (2006.01)
*G11C 8/12* (2006.01)

(52) U.S. Cl.
CPC ............ *G06F 3/0688* (2013.01); *G11C 5/066* (2013.01); *G11C 7/10* (2013.01); *G11C 8/12* (2013.01)

(56) References Cited

U.S. PATENT DOCUMENTS

| | | | |
|---|---|---|---|
| 7,925,854 B2 * | 4/2011 | Oh | ................... G06F 13/4239 710/9 |
| 8,683,270 B2 | 3/2014 | Bueb et al. | |
| 2008/0311684 A1 | 12/2008 | Tu et al. | |
| 2009/0157994 A1 | 6/2009 | Hampel et al. | |
| 2011/0271036 A1 | 11/2011 | Cheng et al. | |

OTHER PUBLICATIONS

"SPI Interface in embedded systems—Module-12 SPI Bus interface," EE Herald, Retrieved Nov. 29, 2015, http://www.eeherald.com/section/design-guide/esmod12.html, 6 pages.

\* cited by examiner

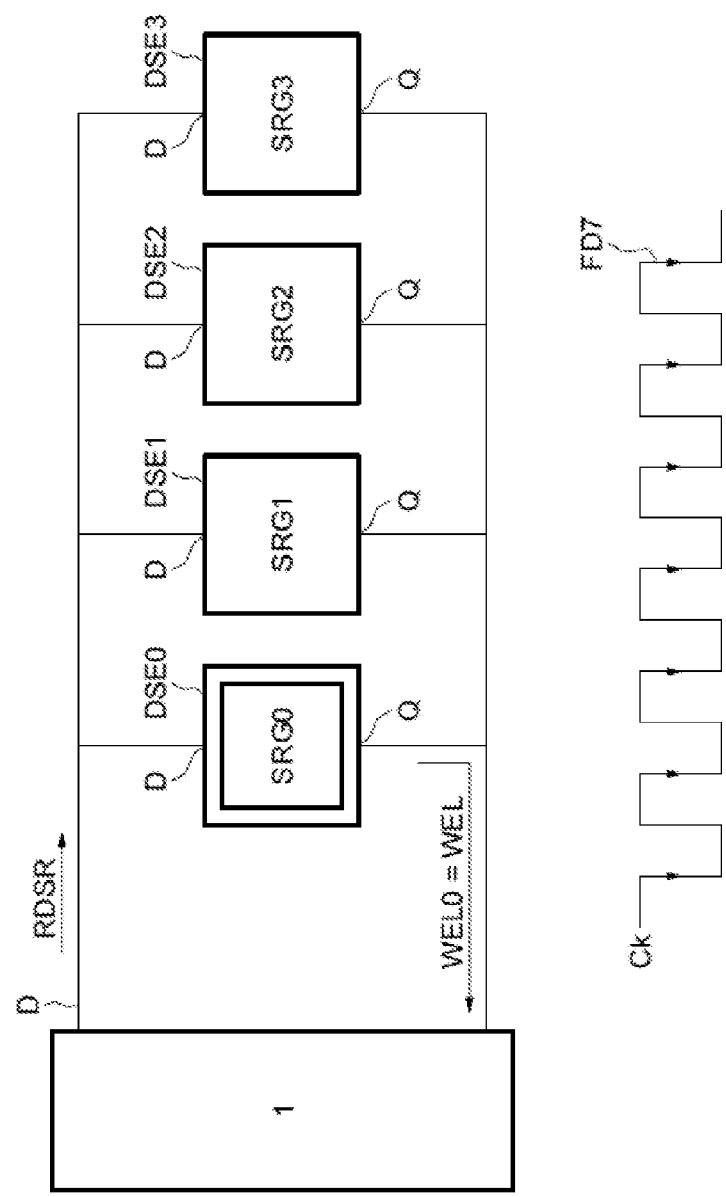

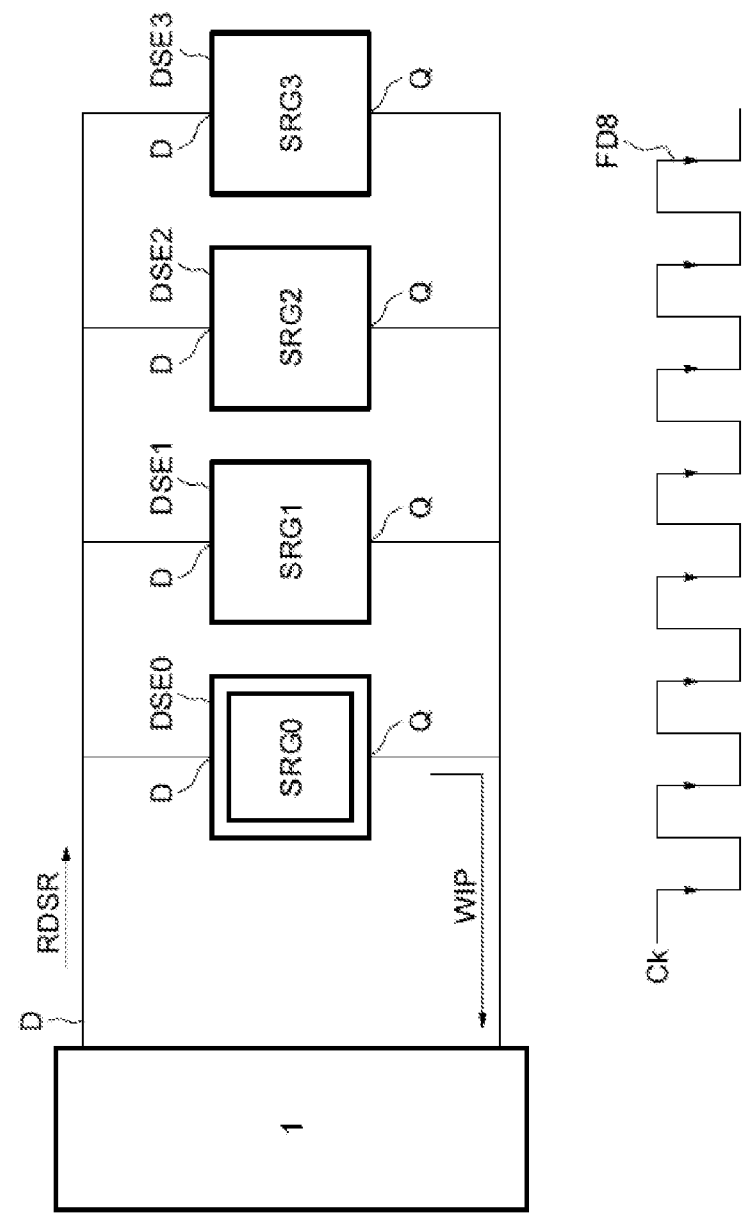

NON-VOLATILE MEMORY DEVICE HAVING A MEMORY SIZE

This application is a continuation of U.S. patent application Ser. No. 15/053,950, filed on Feb. 25, 2016, which claims priority to French Application No. 1559042, filed on Sep. 25, 2015, which applications are hereby incorporated herein by reference.

TECHNICAL FIELD

Embodiments of the present invention relate to a non-volatile memory device having a memory size.

BACKGROUND

Currently, the aim is to produce EEPROM memories that have increasingly high densities, that is to say increasingly significant memory capacities, for example, several megabits.

However, for memory capacities that are too great, it is not possible to produce the memory in a single chip. In this case, the total memory capacity is divided up into a plurality of memory chips. However, the control of these different memory chips can prove complex and in any case require a significant number of input-output resources and dedicated commands.

SUMMARY

Implementations and embodiments of the invention relate to non-volatile memories, for example, the electrically erasable and programmable read-only memories, called EEPROM memories, or even the FLASH memories, notably those intended to be connected to a serial bus, for example, of the SPI (Serial Peripheral Interface) type.

According to one embodiment, it is proposed to simply produce a non-volatile memory device, in particular of large memory capacity, for example, of the EEPROM type, from a plurality of memory chips without requiring any additional resource and without requiring dedicated commands (opcodes) but using conventional commands.

According to one aspect, a memory device is proposed that comprises an input-output interface, a bus of SPI type coupled to the input-output interface, and a plurality of individual non-volatile memory devices connected to the bus of SPI type.

The chip select inputs, commonly referred to by those skilled in the art as "chip select", of each individual memory device, are all connected to one and the same chip select wire of the SPI bus, that is to say to the "chip select" wire.

The individual memory devices are further configured and controllable so as to behave, as seen by the input/output interface, as a single non-volatile memory device, the total memory space of which has a total memory capacity equal to the sum of the individual memory capacities of the individual devices.

Thus, according to this aspect, a non-volatile memory device is formed, in particular one of large memory capacity, by the combination of a bus of SPI type and of a plurality of individual memory devices. Also, it should be noted that one and the same chip select wire of the SPI bus is used for all the individual memory devices instead of one chip select wire being used for each chip. Moreover, the individual memory devices as a whole behave as a single memory device that can be controlled using commands (opcodes) which are conventional commands of a memory device. There is therefore no dedicated control.

Moreover, the total memory space is shared between the different individual memory devices and each individual memory is advantageously responsible for a fixed and dedicated part of this total memory space with regard to the read and write operations.

Thus, when a chip select command is received, each individual memory decodes the command and executes it conditionally on the basis of the content of the command itself and possibly of the current address segment concerned.

In other words, according to one embodiment, each individual memory device comprises an individual controller. Each individual controller is configured to place the corresponding individual memory device in a selected state in the presence of a chip select signal transmitted over the chip select wire of the bus by a master device, for example, a microcontroller, to select the single memory device, and place the corresponding individual memory device in a deselected state in the presence of a chip deselect signal transmitted over the chip select wire of the bus by the master device to deselect the single memory device. Each individual controller is configured to, in the presence of at least one access command to the total memory space of the single memory device present on the serial data input wire of the bus, have the at least one memory access command executed or not by the corresponding individual memory device as a function at least of the content of the command.

More specifically, according to one embodiment, the total memory space is subdivided into a plurality of individual memory spaces respectively allocated to the plurality of individual memory devices, and, in the presence of the memory access command associated with an address of the total memory space, each individual controller is configured to determine whether the corresponding individual memory device is affected or not by the memory access command as a function of the content of at least a part of the address.

In this respect, each individual memory device is advantageously assigned an identifier on the bus corresponding to the individual memory space which is allocated to it. This identifier can be obtained in hardwired fashion using an external pin or else programmed in a non-volatile register of the memory.

According to one embodiment, each individual memory device comprises a so-called individual status register, configured to store an individual status word, typically one byte. Moreover, a status word having a structure similar to the individual status word is associated with a virtual status register of the single memory device.

The status register of the single memory device is the to be "virtual" in as much as it does not exist physically in addition to the individual status registers of the individual memory devices. That the, the master element of the bus of SPI type, for example, a microcontroller, will be able to control the single memory device to write or to read this virtual status register as if it truly existed, from a status word (generally one byte) which has a structure similar to the individual status words usually used in the memory devices. To this end, all of the individual status registers and a combinational logic will be used to form this virtual status register and this will be totally transparent for the microcontroller which, using conventional status register write and read commands will be able to modify certain bits of the virtual status register or read all of the virtual status register as if it were interrogating a single memory device physically having a status register.

Thus, according to one embodiment, each individual memory device comprises an individual controller or control logic, and, in the presence of a write command for the virtual status register, for example, designated by the acronym WRSR (Write Status Register), each individual controller is configured to decode the command and at least as a function of the current values of certain bits of the status word, present in the individual status registers, for example, the values of the bits designated by the acronyms WEL (Write Enable Latch), SRWD (Status Register Write Disable), and possibly as a function of the logic state of a pin of each individual memory device (known to those skilled in the art by the acronym WP (Write Protect), the individual controllers are configured to either all not execute the command or all execute the command so as to respectively write, in all the individual status registers, the same values for the respective bits concerned.

According to one embodiment, the status word associated with the virtual register includes a specific bit (designated, for example, by the acronym WIP for Write In Progress), representative of the presence or of the absence of a write cycle currently being executed in the total memory space of the single memory device. This specific bit has the same function, but related to the total memory space, as the specific individual bit WIP present in an individual status register of an individual non-volatile memory.

Also, in the presence of a virtual status register read command, for example, an RDSR (Read Status Register) command, the individual controller of just one of the individual memory devices, for example, the one having the identifier number 0, is configured to generate the value of the specific bit (WIP) of the virtual status register from the values of the peer individual specific bits (WIP) of all the individual status registers, and to deliver this generated specific bit (WIP) and the other individual status bits which correspond to the other bits of the status word associated with the virtual status register.

In this respect, the individual controllers of the other individual memory devices (those, for example, assigned identifiers with numbers different from 0) are advantageously configured to sequentially deliver the values of their specific individual bits (WIP) over the bus at the rate of the clock signal intended to clock the bus, in place of unused bits of an individual status word.

According to one embodiment, each individual memory device comprises an individual write enable latch circuit, commonly designated by those skilled in the art by the acronym WEL (Write Enable Latch) having a first state in which it stores a first logic value, for example, equal to "1", corresponding to a write enable in the individual memory space or in the individual status register, and a second state in which it stores a second value, for example "0", corresponding to a write disable in the individual memory space or in the individual status register.

A write enable bit is then associated with a virtual write enable latch circuit of the single memory device, the logic value of this bit, that can also be designated by the acronym WEL, is equal to the logic values of the corresponding individual bits stored in the individual latch circuits.

The first logic value of this WEL bit ("1" for example) thus corresponds to a write enable in the total memory space or in the virtual status register whereas the second logic value of this bit ("0" for example) corresponds to a write disable in the total memory space or in the virtual status register.

Here again, the "virtual" nature of the write enable latch circuit means that this virtual latch circuit does not physically exist in addition to the individual write enable latch circuits, but the microcontroller will be able to write in this "virtual" latch circuit as if it truly existed.

Each individual controller is configured to position the corresponding individual write enable latch circuit in its first state in the presence of a first specific positioning command for the virtual write enable latch circuit present on the bus, for example, a command designated by the acronym WREN (Write Enable). Each individual controller is configured to position the individual write enable latch circuit in its second state in the presence of a second specific positioning command for the virtual write enable latch circuit present on the bus, for example, a command designated by the acronym WRDI (Write Disable), or on the execution of a write command in the virtual status register, for example, a command designated by the acronym WRSR (Write Status Register), or even on the execution of a write command in a memory location of the individual memory space of at least any one of the individual memory devices.

Returning now to the memory access commands, when such a command is a write access command, an individual controller is advantageously configured to have the write executed in the individual memory space of the corresponding individual memory device if the corresponding individual memory device is actually affected by the write access command, if the memory location designated by the address does not belong to a write-protected memory area and if the individual write enable latch circuit (WEL) is positioned in its first state (WEL=1).

When the memory access command is a read access command, an individual controller is advantageously configured to have the read executed in the individual memory space of the corresponding individual memory device if the corresponding individual memory device is affected by the read access command.

The read access command can sequentially affect a plurality of individual memory devices. In this case, the individual controller of the first individual memory device affected is configured to have the command executed, then to release the bus and place the first individual memory device in an idle state so that the next individual memory device affected can in turn take control over the bus and so on until the last individual memory device affected executes the read access command.

By way of example, the memory device can comprise two or four individual memory devices. Thus, as a non-limiting example, with four memory devices each having an individual memory capacity of 4 Mbits, it is possible to form a single memory device having a memory capacity of 16 Mbits.

The memory device can, for example, be encapsulated in a package so as to form a single chip accessible by a bus of SPI type, the individual memory devices being able, for example, to be stacked in the package.

The individual memory devices can be of the EEPROM type, or else of the FLASH type so as to form a single EEPROM or FLASH memory of large capacity.

BRIEF DESCRIPTION OF THE DRAWINGS

Other advantages and features of the invention will become apparent on studying the detailed description of non-limiting embodiments and the attached drawings in which:

FIGS. 1 to 24 schematically illustrate different embodiments of a memory device according to the invention.

DETAILED DESCRIPTION OF ILLUSTRATIVE EMBODIMENTS

Figure 1:
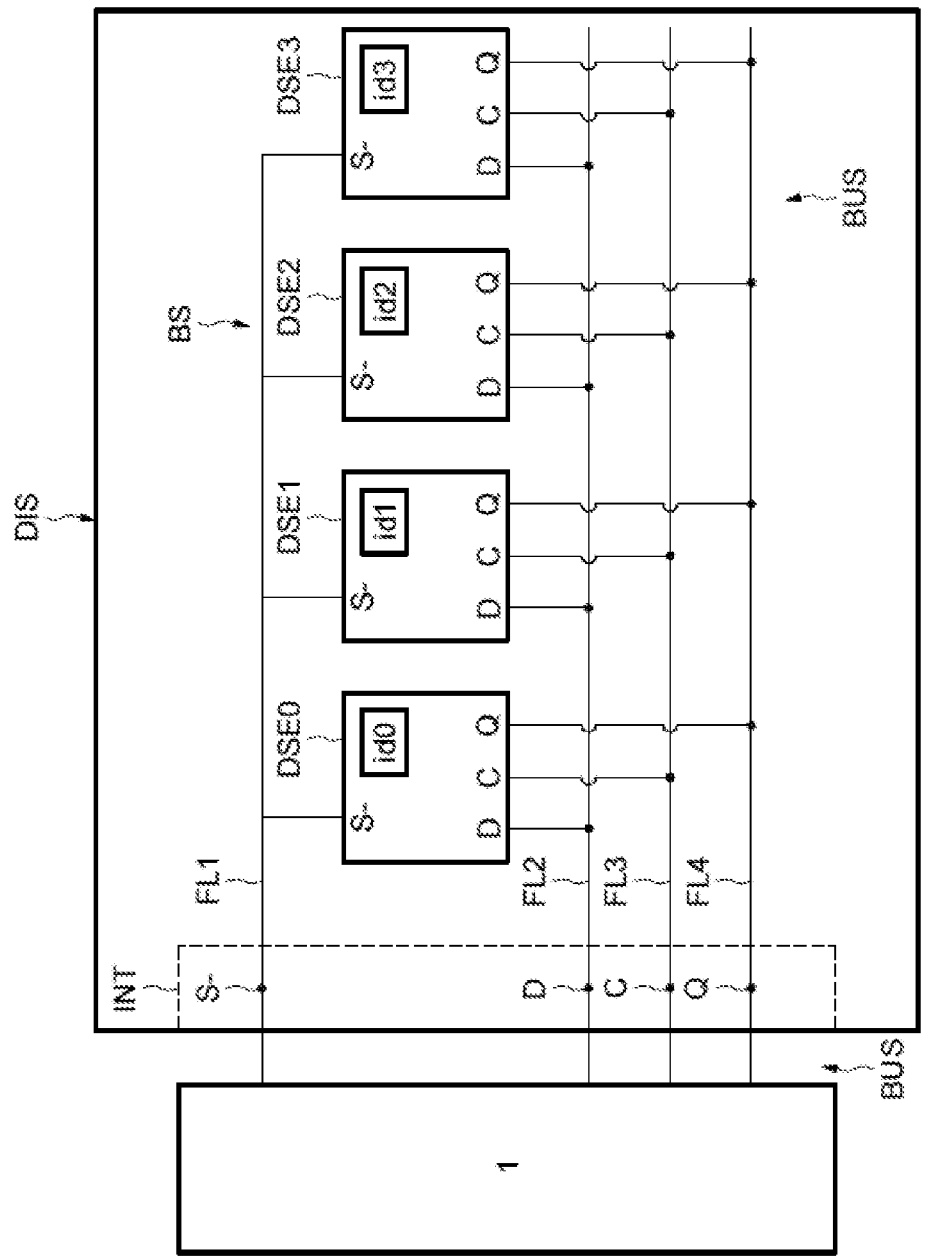

In FIG. 1, the reference DIS denotes a single memory device, for example, of the EEPROM type, connected over a bus referenced BUS of SPI type to a master element 1, for example, a microcontroller, via an input-output interface INT.

Hereinafter in the text, and for the purposes of simplicity, certain elements and/or signals and/or bits will be designated by references identical to the acronyms commonly known to those skilled in the art.

The bus BUS is an SPI bus with four wires FL1, FL2, FL3, FL4.

The first wire FL1 is a wire intended to convey a chip select or chip deselect signal (signal S−: "Chip Select") which is in the low state for the select and in the high state for the deselect.

The wire FL2 is a wire intended to convey input serial data (signal D: "serial data in").

The wire FL3 is a wire intended to convey a serial clock signal (C: "serial clock") and the wire FL4 is a wire intended to convey the serial outputs (Q: "serial output").

The device DIS here comprises four individual memory devices, of EEPROM type, referenced DSE0, DSE1, DSE2 and DSE3.

Each individual memory device DSEi comprises a chip select input S− coupled to the wire FL1 and to the corresponding input-output S− of the interface INT. Each device DSEi also comprises an input D connected to the wire FL2 and therefore to the input D of the interface INT, a clock input C connected to the wire FL3 and therefore to the input C of the interface INT, and an output Q connected to the wire FL4, and therefore to the output Q of the interface INT.

Each individual memory device DSEi further comprises an identifier idi which will be returned to in more detail hereinbelow with respect to the nature and the function.

As will be seen in more detail hereinbelow, the individual memory devices DSE0-DSE3 are further configured to be controllable so as to behave, as seen by the input/output interface INT, as a single memory device DIS, the total memory space of which has a total memory capacity equal to the sum of the individual memory capacities of the individual devices.

Figure 2:
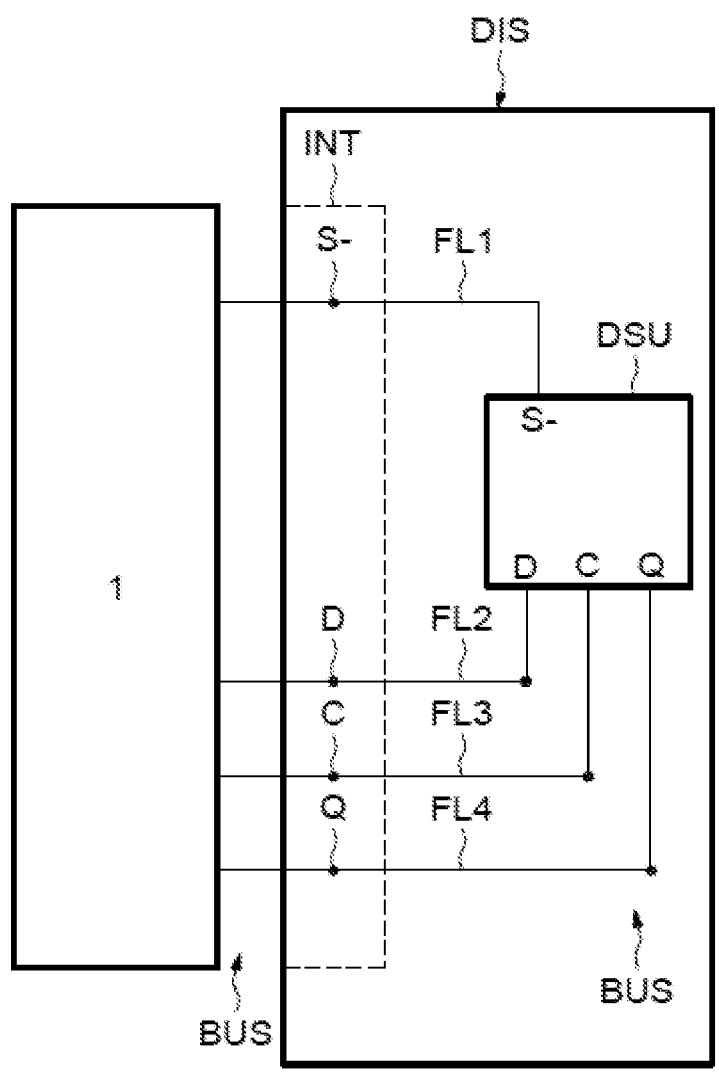

This is illustrated schematically in FIG. 2 in which the four individual memory devices DSEi have been replaced by a single memory device of EEPROM type, referenced DSU, connected to the four wires FL1-FL4 of the SPI bus via a chip select input S−, inputs D and C and an output Q.

This is what the master element 1 or microcontroller sees when it controls the memory device DIS.

These four individual memory devices DSEi can be stacked in one and the same package.

Figure 3:
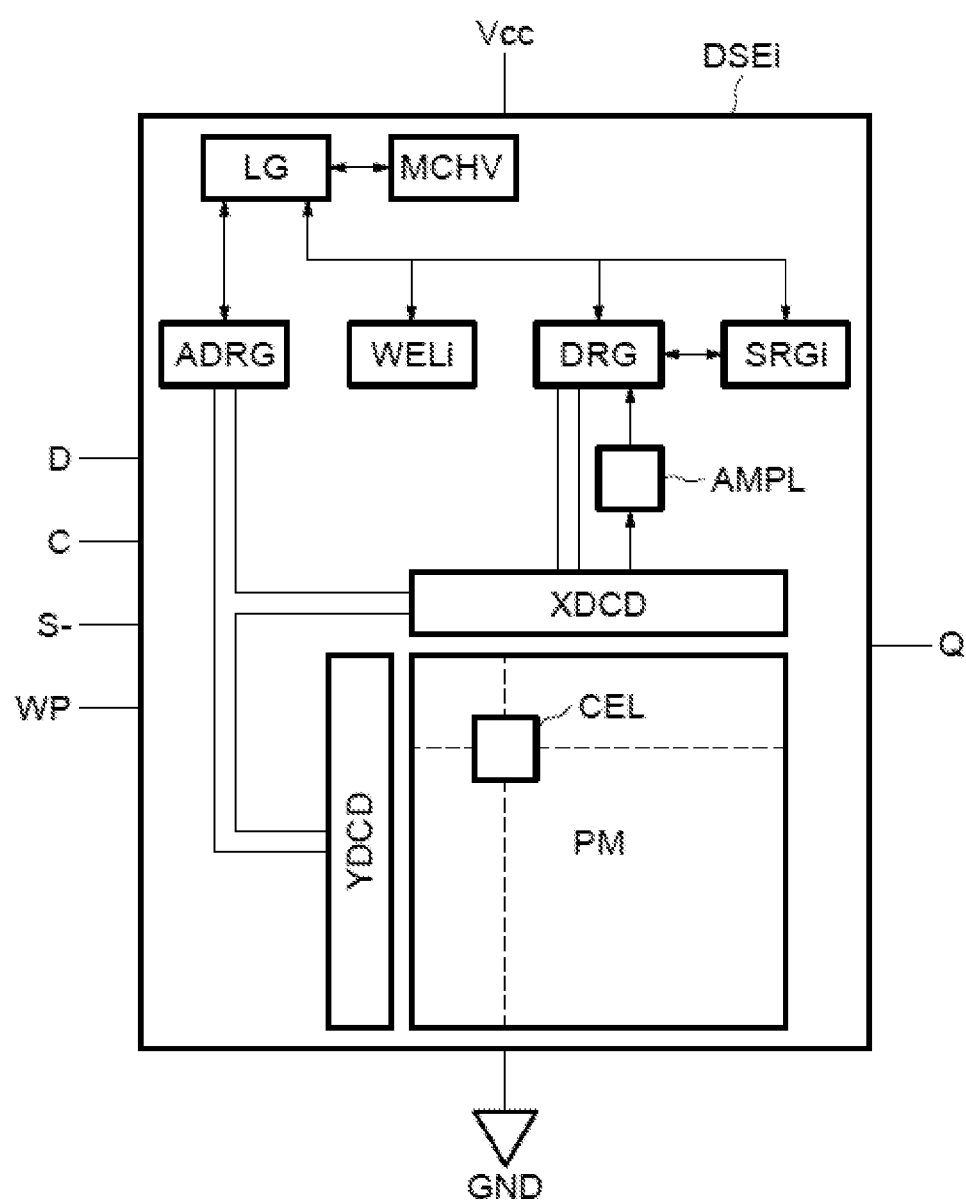

As illustrated in FIG. 3, each individual memory device DSEi is powered between a power supply voltage Vcc and the ground and for the most part comprises circuits characteristic of an EEPROM memory that are conventional and known per se.

More specifically, the memory plane PM, of a structure that is conventional and known per se, comprises memory cells CEL of EEPROM type.

A column decoder XDCD and a row decoder YDCD make it possible to address the memory plane.

These decoders are themselves addressed by an address shift register ADRG.

A data shift register DRG is also provided, connected to the memory plane via the decoder XDCD.

The addresses and data can be entered by the address register ADRG and data register DRG respectively and the data can be fetched via the data register DRG.

A block AMPL of read amplifiers (sense amplifiers) is also connected between the decoder XDCD and the register DRG and used in read mode.

The individual memory device DSEi also comprises an individual status register SRGi linked to the data register DRG.

The memory device also comprises an individual write enable latch circuit WELi which, as will be seen in more detail hereinbelow, has a first state in which it stores a first logic value corresponding to a write enable in the individual memory space or in the individual status register, and a second state in which it stores a second value corresponding to a write disable in the individual memory space or in the individual status register.

Finally, high-voltage generator MCHV, notably comprising a charge pump and its associated regulation, make it possible to generate a high voltage, typically of the order of 15 volts, to allow for the data write operation in the memory, typically comprising an erasing step followed by a programming step.

All of these circuits are controlled by a control logic or individual controller LG.

Compared to a conventional EEPROM memory, a few minor modifications are made in the address register ADRG which comprises additional stages and also in the control logic.

The individual memory device DSEi comprises, moreover, conventional pins D, C, S− and Q, and a WP pin intended to implement a write-mode hardware protection of the device DSEi.

The logic state of the pin WP conditions the writing in the individual status register SRGi in conjunction with a bit SRWDi (Status Register Write Disable) which makes it possible to define whether the individual status register is or is not write protected.

Figure 4:
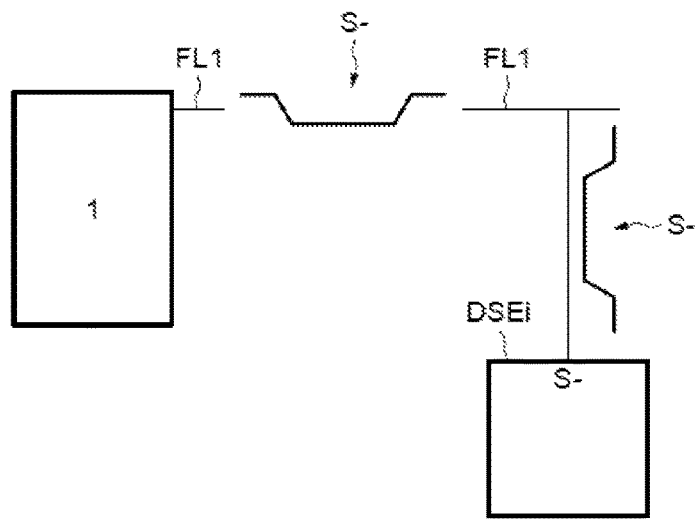

Referring now more particularly to FIG. 4, it can be seen that the chip select/deselect signal S−, transmitted by the microcontroller 1 over the wire HA of the bus, is transmitted to all the individual memory devices DSEi.

Because of this, when the microcontroller 1 transmits, over the chip select wire, the signal S− in the low state to select the single memory device DSU, each individual controller LG is configured to place the corresponding individual memory device DSEi in a selected state.

Similarly, when the microcontroller 1 deselects the single memory device DSU, the individual logic of the corresponding memory device DSEi places this individual memory device in a deselected state.

As indicated above, each individual memory device DSEi comprises an individual write enable latch circuit WELi.

Figure 5:
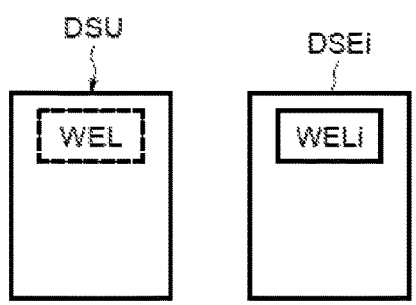

So that the microcontroller 1 can also enable or disable the writing in the total memory space or in, as will be seen in more detail hereinbelow, a virtual status register of the single memory device DSU, a write enable bit WEL (Write Enable Latch) is associated with a virtual write enable latch WEL (Write Enable Latch) of the single memory device DSU (FIG. 5).

For the purposes of simplicity, the bit associated with the virtual latch has the same reference WEL as the virtual latch itself.

This write enable latch circuit WEL is virtual in as much as it does not physically exist in addition to the individual latch circuits WELi but in fact comprises all the individual write enable latch circuits WELi.

The logic value of the bit WEL is equal to the logic values of the bits WELi stored in the individual latch circuits.

Thus, the first logic value of this bit WEL, "1" for example, corresponds to a write enable in the total memory space or in the virtual status register of the memory device DSU while the second logic value of the bit WEL, "0" for example, corresponds to a write disable in the total memory space or in the virtual status register.

Figure 6:
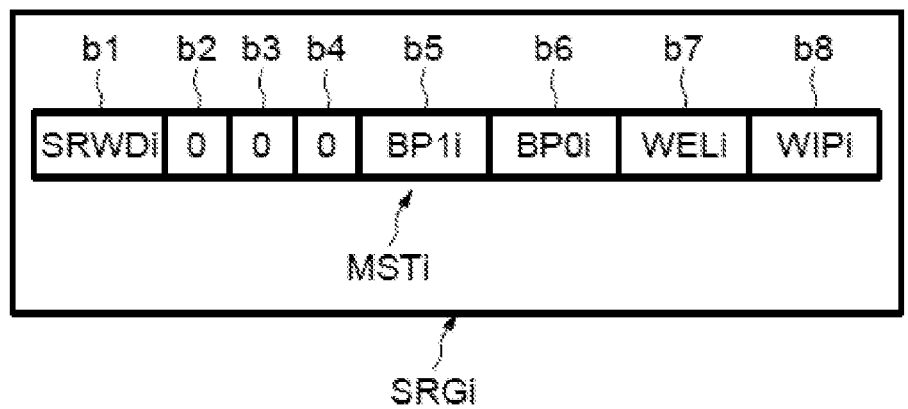

As illustrated in FIG. 6, each individual memory device comprises an individual status register SRGi configured to store an individual status word, here one byte, MSTi.

In this exemplary embodiment, characteristic of an EEPROM memory, the first bit b1 of the status byte MSTi is the bit SRWDi (Status Register Write Disable) which makes it possible to define whether the individual status register is or is not write protected.

Thus, if this bit is equal to 1 and the pin WP is at 0, then the individual status register is write protected.

If these conditions are not met, the individual status register can be modified in write mode.

The bits b2, b3 and b4 are unused bits and here equal to 0.

The bits b5 and b6, respectively referenced BP1$i$ and BP0$i$ make it possible to define possible write-protected memory areas.

Thus, for example, if the two bits BP1$i$ and BP0$i$ are equal to 0, there is no write-protected memory area.

If the bit BP1 is equal to 0 and the bit BP0 is equal to 1, then the memory area of the individual memory space protecting the write is the one situated in the bottom quarter of the individual memory space.

If the bit BP1 is equal to 1 and the bit BP0 is equal to 0, then the write-protected area of the individual memory space is equal to the bottom half of this individual memory space.

If the two bits BP1 and BP0 are equal to 1, then all of the individual memory space is write protected.

The bit b7 is in fact the bit WELi.

Finally, the bit b8 referenced WIPi (Write In Progress) is a bit representative of the presence or of the absence of a write cycle currently being executed in the individual memory space of the corresponding individual memory device.

More specifically, if this bit is equal to 1, then a write cycle is currently being executed in the individual memory space but not if this bit is equal to 0.

Figure 7:
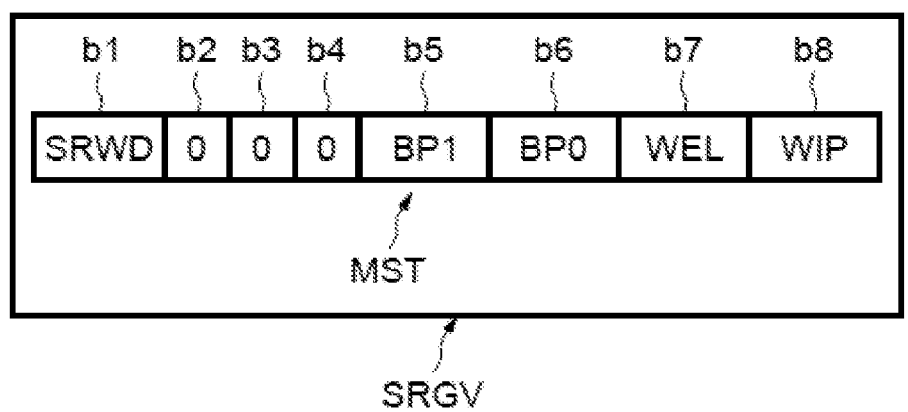

As illustrated in FIG. 7, a status word MST, here one byte, having a structure similar to the individual status word MSTi is associated with a virtual status register SRGV of the single memory device DSU.

This status register SRGV is the to be virtual in as much as it does not exist as a single physical register but comprises all of the individual status registers SRGi as well as, as will be seen in more detail hereinbelow, a logic circuit making it possible to generate the eighth bit b8 of this status word MST, in this case the bit WIP.

The status byte MST consequently comprises the bit SRWD, three bits b2-b4 equal for example to 0, the bits BP1 and BP0, the bit WEL and finally the bit WIP.

As indicated above, the bit SRWD makes it possible to define a write protection or absence thereof of the register SRGV and the bits BP1 and BP0 make it possible to define memory areas of the total memory space that are write protected.

The bit WIP defines the presence or the absence of a write cycle currently being executed in the total memory space of the total device DSU.

Figure 8:
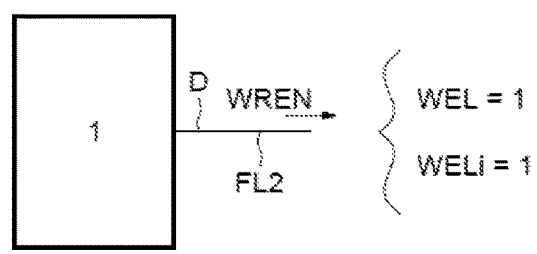

Reference is now made to FIG. 8 and subsequent figures to illustrate the behaviour of the memory device DIS in the presence of different commands (opcodes).

FIG. 8 illustrates the case where the microcontroller 1 transmits, over the wire FL2 of the bus SPI (wire D) the WREN (Write Enable) command, the aim of which is to position the virtual write enable latch circuit WEL in its first state (equal to 1, for example).

In this case, as illustrated in FIG. 8, each individual controller is configured to position the corresponding individual write enable latch circuit WELi also in its first state (equal to 1).

Figure 9:
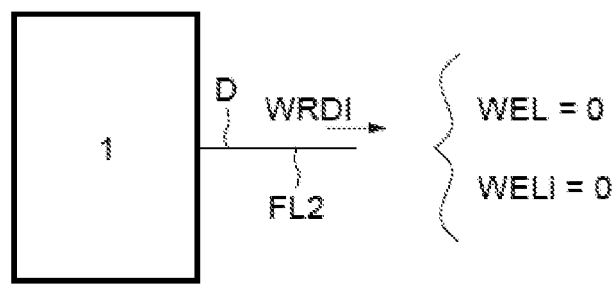
Figure 10:
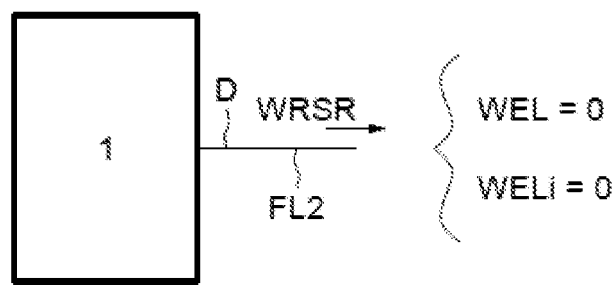
Figure 11:
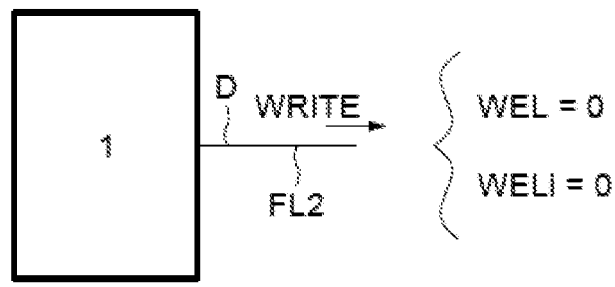

FIGS. 9 to 11 more specifically illustrate the situations in which the virtual latch circuit WEL and each individual latch circuit WELi are positioned in their second state (equal to 0).

Such is the case when the microcontroller transmits, over the wire FL2 of the bus, a specific WRDI (Write Disable) command. In this case, each individual controller unconditionally executes this command and resets the corresponding individual latch circuit WELi to 0.

As illustrated in FIG. 10, the virtual latch circuit WEL and each individual latch circuit WELi can also be reset to 0 on the execution of a write command WRSR (Write Status Register) for the virtual status register.

Such is also the case, as illustrated in FIG. 11, on the execution of a valid write command WRITE transmitted by the microcontroller 1.

As will be seen in more detail hereinbelow, even if such a WRITE command is executed by just one of the individual memory devices DSEi, each individual device on the bus detects the conditions of the execution of such a write command and repositions its individual latch circuit WELi to 0.

In practice, this can occur for example when the signal S– returns to the high state, the return to the high state initiating, if appropriate, the non-volatile write cycles.

Thus, at each instant, all the individual latch circuits WELi and consequently the virtual latch circuit WEL are synchronized, that is to say that they contain the same logic value.

Figure 12:
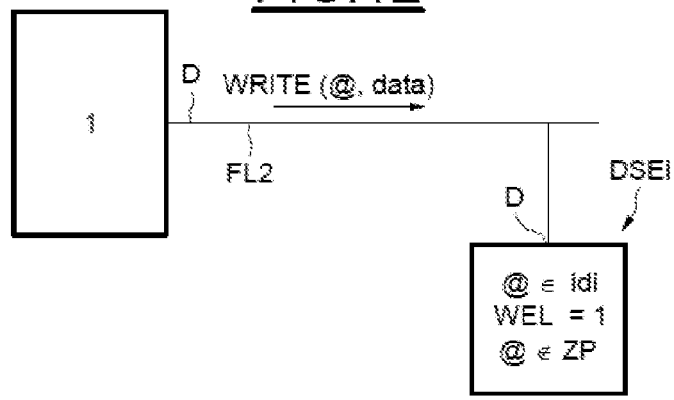
Figure 13:
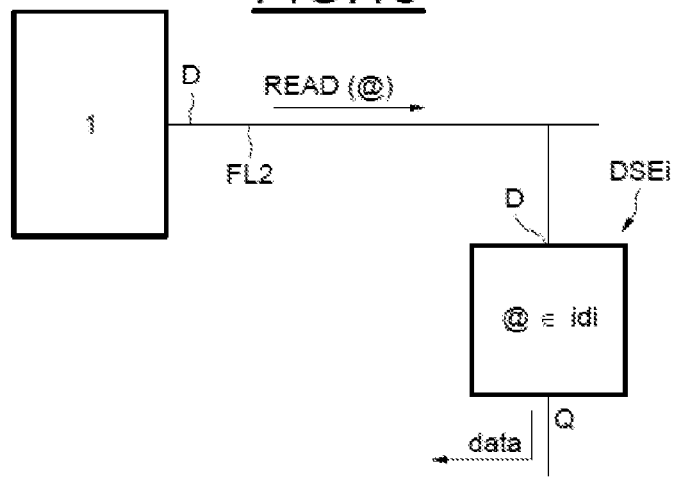
Figure 14:
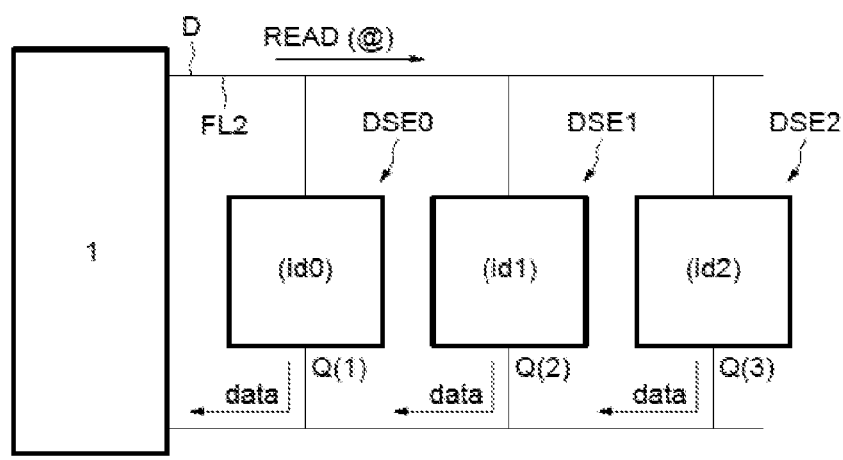

Reference is now made more particularly to FIGS. 12 to 14 to illustrate writes and reads in the total memory space of the single memory device DSU.

It is assumed in this respect that each individual memory device DSEi knows that the invention is implemented, that is to say that there is more than one individual memory device on the bus.

It is also assumed that each individual device knows the number of individual memory devices on the bus and its identifier on the bus.

The indication of the implementation of the invention (more than one individual memory device on the bus) can be obtained using an external pin or a non-volatile configuration bit.

The number of individual memory devices on the bus can also be known using another non-volatile configuration bit.

Thus, by way of example, a zero value for this configuration bit means that there are two individual memory devices on the bus and a 1 value for this bit means for example that there are four individual memory devices on the bus.

On initialization, all the individual memory devices on the bus can write this configuration bit in parallel with the same value.

Moreover, as indicated above, each individual memory device DSEi is allocated the identifier idi.

This identifier can be determined physically by hardware by an external pin.

Thus, in the case of two individual memory devices on the bus, this external pin soldered to the ground confers the identifier id0 on the individual memory device DSE0 whereas this external pin soldered to the power supply voltage confers on the corresponding individual memory device the identifier id1.

In the case of four individual memory devices on the bus, it is possible to use four resistors having four different values. Each resistor has one terminal connected to the power supply voltage and the other terminal connected to one of the pins of an individual memory device.

It is also possible to use a non-volatile register to store the value of the identifier for each individual memory device.

Moreover, each individual memory device has a known fixed individual memory space of the total memory space allocated to it. Thus, knowing the number of individual memory devices on the bus and its identifier, each individual memory device can determine the address segment for which it is responsible.

Thus, for example, in the case of a total memory space having a memory capacity of 16 Mbits formed by four individual memory spaces of 4 Mbits each, the total address segment varies from 00 00 00 to 1F FF FF.

Also, in this case, the individual memory device having the identifier id0 can manage the address segment varying from 000000 to 07 FF FF.

The individual memory device having the identifier id1 can manage the address segment ranging from 080000 to 0f FF FF.

The individual memory device having the identifier id2 can manage the address segment ranging from 100000 to 17 FF FF.

The individual memory device having the identifier id3 can manage the address segment ranging from 180000 to 0 FF FF.

Other situations can be possible.

Thus, the value of the identifier can be linked to the address parity (in the case where two individual memory devices are situated on the bus) or even to the modulo 4 congruence (if four individual memory devices are situated on the bus).

Thus, in this latter case, an individual memory device having an identifier equal to 0 can manage the addresses of XX XX XX 00 type.

An individual memory device having an identifier equal to 1 can manage the addresses of XX XX XX 01 type.

An individual memory device having an identifier equal to 2 can manage the addresses of XX XX XX 10 type, whereas the individual memory device having an identifier equal to 3 can manage the addresses of XX XX XX 11 type.

FIG. 12 illustrates the case of a WRITE memory access command associated with an address @ of the total memory space of the device DSU and with the data, data. In practice, the WRITE "opcode" command is followed sequentially by the address @ then the data, data.

When such a command is received, all the individual controllers LG of the individual memory devices decode it and will compare, for example, the most significant bits (1 or 2) of the received address to their identifier (made up of 1 or 2 bits).

The individual memory device for which the value of the identifier corresponds to the most significant bit(s) of the received address will execute the write command whereas the other individual memory devices will remain in an idle state.

Thus, at a given instant, only an individual memory device can write a datum provided, obviously, that the write operation is enabled (WELi=1) and the address does not belong to a protected area ZP defined by the bits BP1 and BP0.

In practice, the individual memory device concerned will prepare the write cycle while the signal S– is in the low state and execute it on the rising edge of this signal S–.

FIG. 13 illustrates the case of a read command READ associated with an address @ transmitted by the microcontroller to the memory device DSU. On reception of this READ command, all the individual controllers of an individual memory device decode it and will compare the most significant bit(s) of the received address to their identifier.

Here again, the device DSEi for which the identifier corresponds to the most significant bit(s) of the address will execute the read command whereas the other individual memory devices will remain in the idle state.

As illustrated in FIG. 14, the read command READ being sequential, the data, data are delivered sequentially with the address register incremented by one with each byte read.

Thus, an individual memory device, for example, the one with the identifier id0, will continue to deliver the data, data as long as the current address is situated within its address segment.

As soon as the address reaches the end of its segment, the device DSE0 delivers the last datum, releases the bus, and returns to an idle state.

With each individual memory device having its address register synchronized on the current address, the individual memory device having the next identifier will then take control of the bus and output the data contained in its own segment, and so on.

This is totally transparent to the master element, namely the microcontroller 1.

Figure 15:
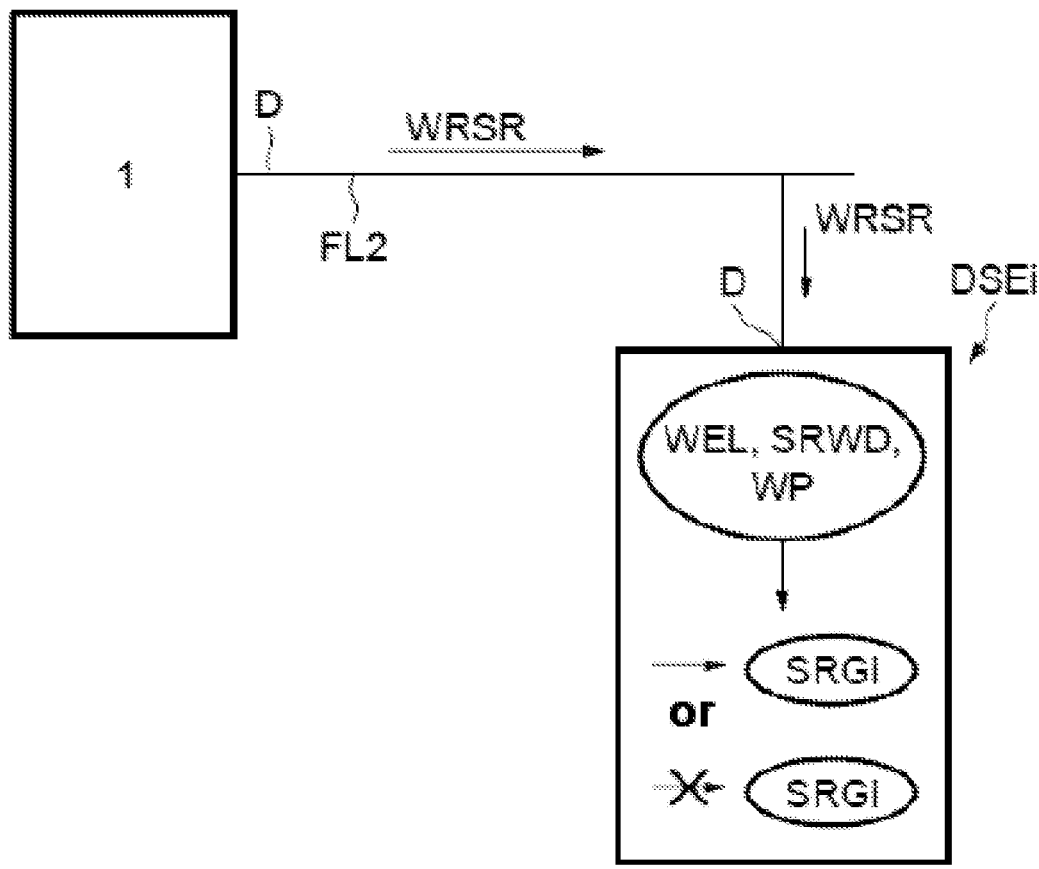

FIG. 15 illustrates the case of a write command WRSR (Write Status Register) in the virtual status register transmitted by the microcontroller 1 over the wire FL2 of the bus.

This command makes it possible to write the non-volatile bits SRWD, BP1 and BP0 of the status word MST.

This command will be decoded unconditionally by all the individual memory devices.

That being the case, based on the current values of the bits WELi, SRWDi and on the logic state of the pin WP, either no individual controller LG will have the command executed or all the individual controllers of the individual memory devices will have the command executed and have the same value programmed for the bits SRWi, BP1 and BP0 of all the individual status registers.

FIGS. 16 to 24 illustrate the case of a command RDSR (Read Status Register) transmitted by the microcontroller 1 in order to read the virtual status register.

So as to avoid any conflict on the wire FL4 (Q) of the SPI bus, just one individual memory device at a time can deliver data over this wire.

So, provision is made for just one individual memory device, for example, the device DSE0, to deliver as output the bits SRWD, BP1, BP0, WEL and WIP of the virtual status register.

So that the memory device DSU behaves like a single memory device, the bit WIP of the virtual status register has to be read at 1 if at least one of the individual memories DSEi is in the process of performing a write cycle and at 0 if none of the individual memories is in the process of executing a write cycle.

However, each individual memory device DSEi is not by default aware of the end or otherwise of a write cycle performed by the other individual memories.

In particular, in order to deliver the bit WIP, the individual memory device having the identifier 0 (DSE0) has to know the status of the other three memory devices on the bus.

One solution to this problem provides for the individual memory devices DSE1-DSE3 to sequentially transmit the values of their specific bit WIPi at the rate of the clock signal CK in place of the unused bits 000 of the individual status registers.

This will be explained in more detail hereinbelow.

Figure 16:
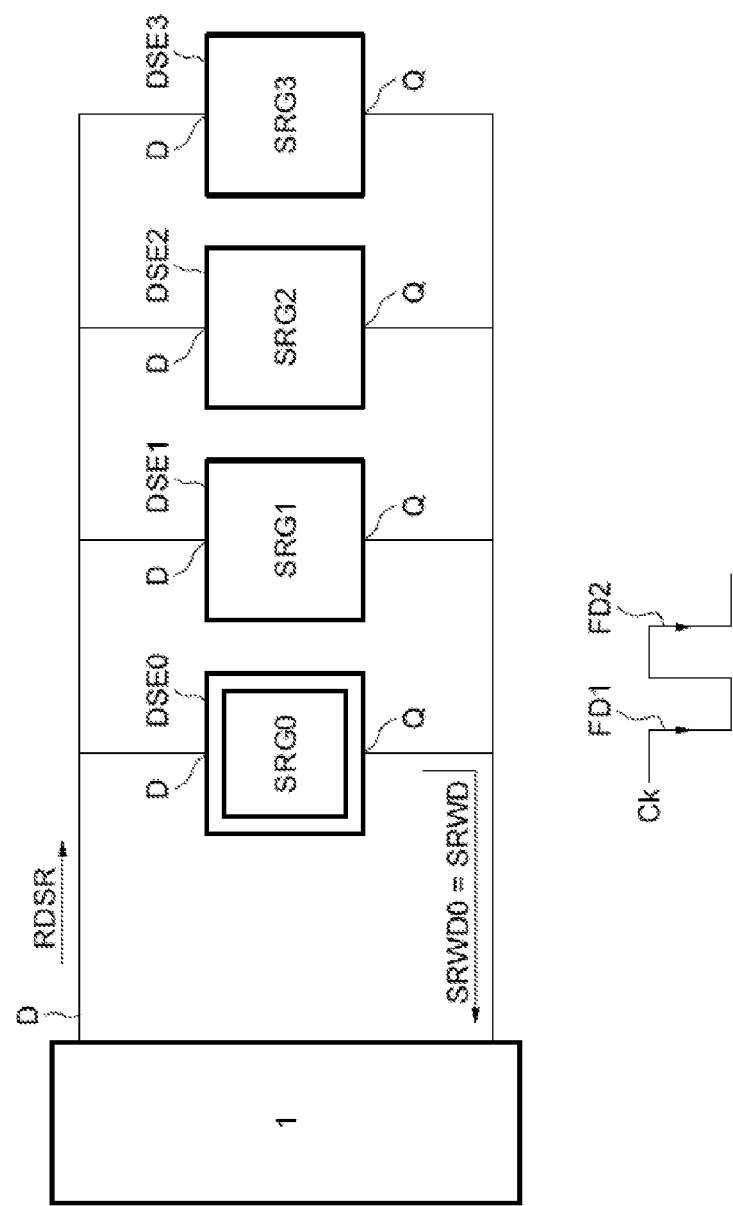

If reference is made to FIG. 16, it can be seen that, on the first falling edge FD1 of the clock signal CK, the individual memory device DSE0 transmits the bit SRWD0 from its individual status register, which corresponds to the bit SRWD of the virtual status register.

Then, the device DSE0 releases the bus on the second falling edge FD2 of the clock signal.

Figure 17:
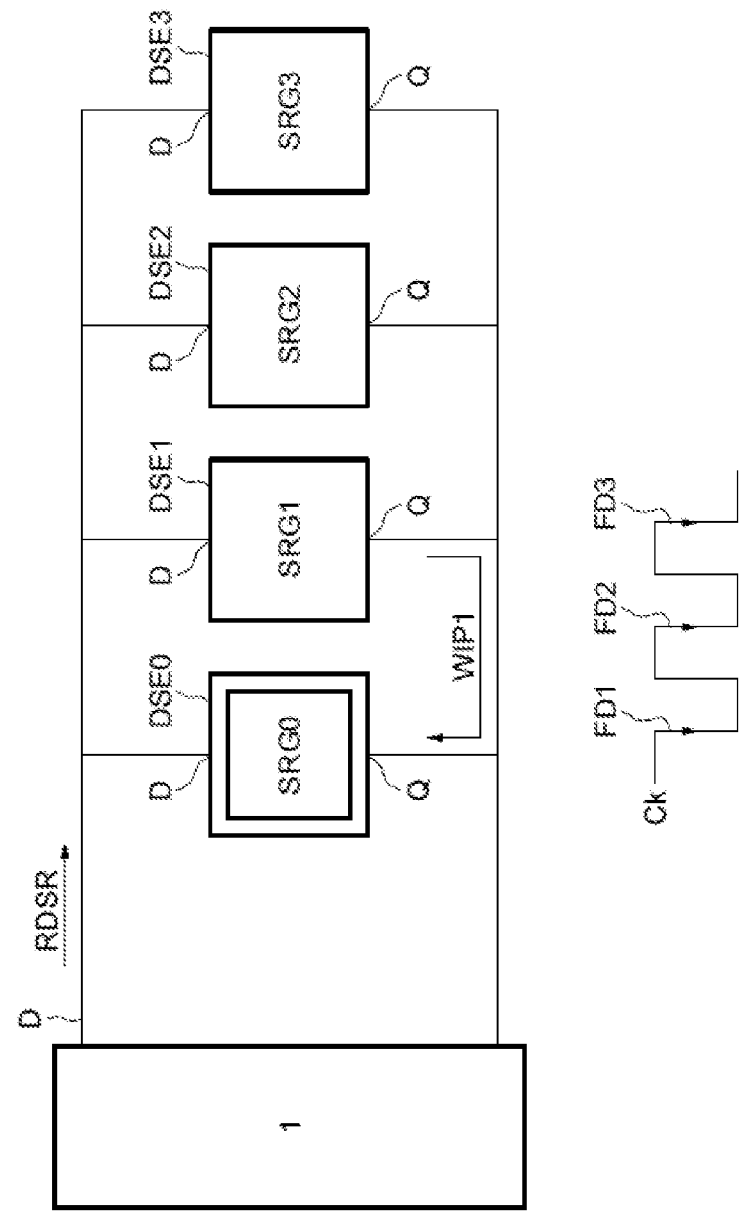

The individual memory device DSE1 then delivers its bit WIP1 on the second falling edge FD2 of the clock signal CK in place of an unused bit, then releases the bus on the third falling edge FD3 of the signal CK (FIG. 17).

Figure 18:
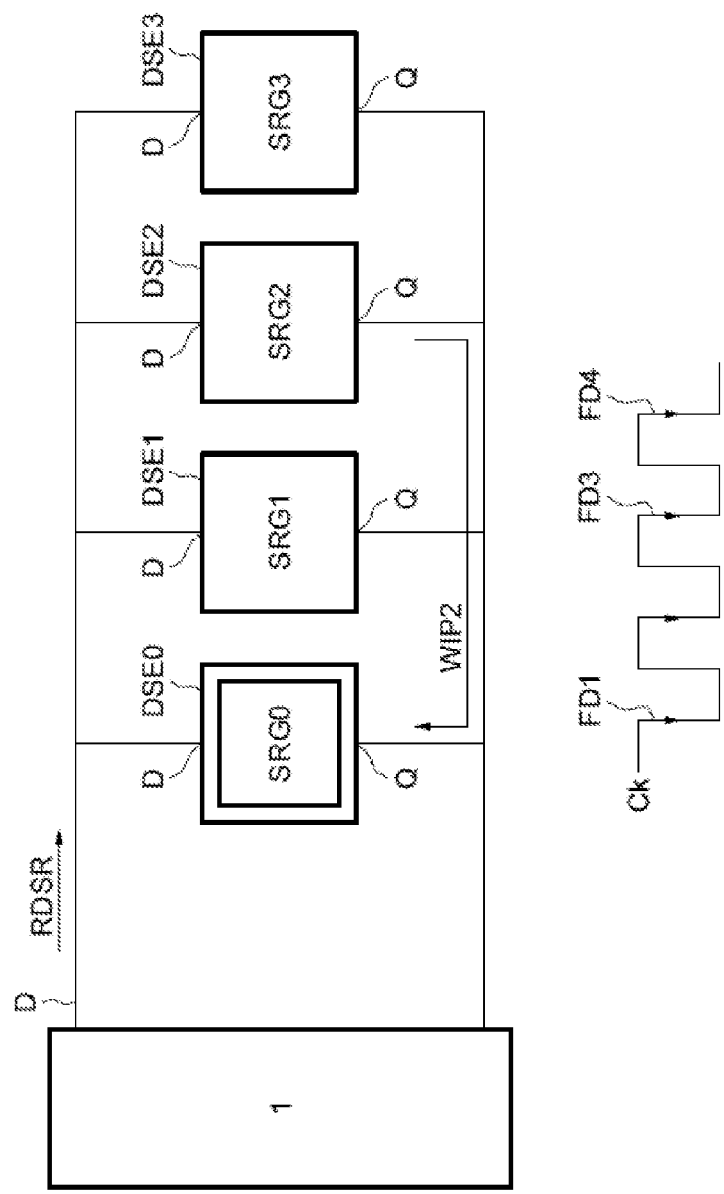

The individual memory device DSE2 then delivers its bit WIP2 on the third falling edge FD3 of the clock signal CK in place of an unused bit, then releases the bus on the fourth falling edge FD4 (FIG. 18).

Figure 19:
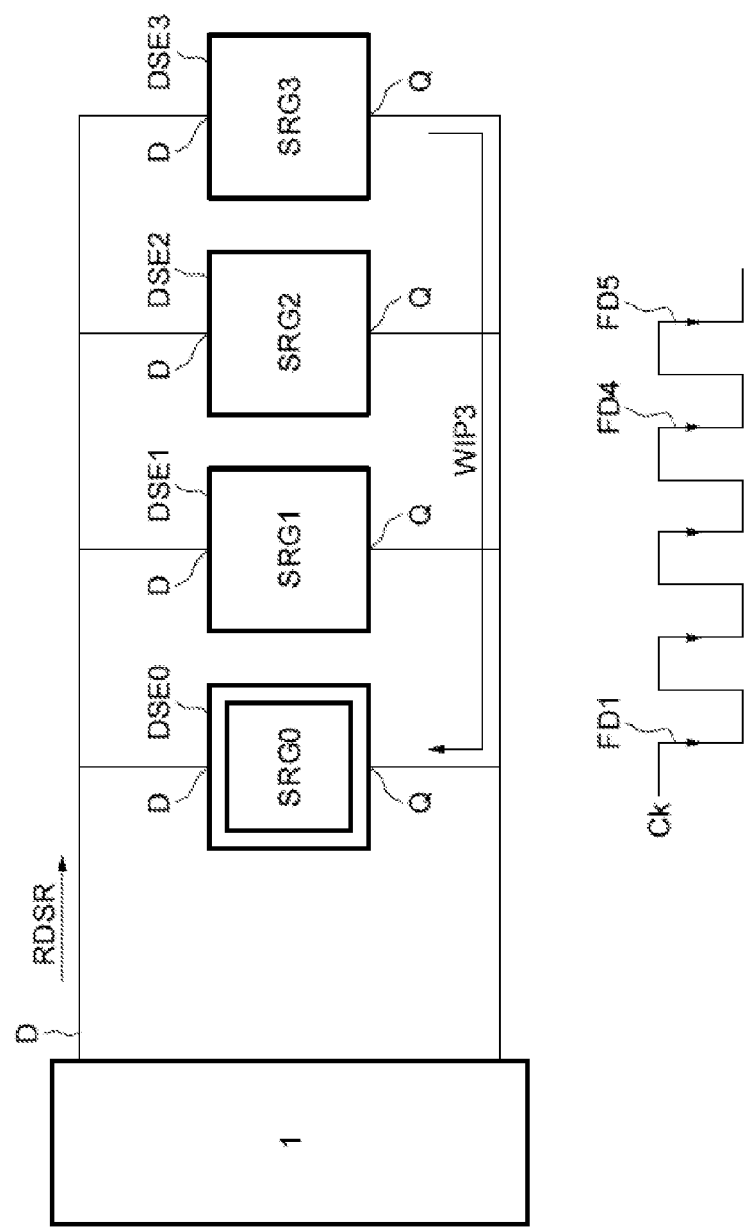

The individual memory device DSE3 then delivers the bit WIP3 on the fourth falling edge FD4 of the clock signal CK in place of an unused bit, then releases the bus on the fifth falling edge FD5 (FIG. 19).

Figure 20:
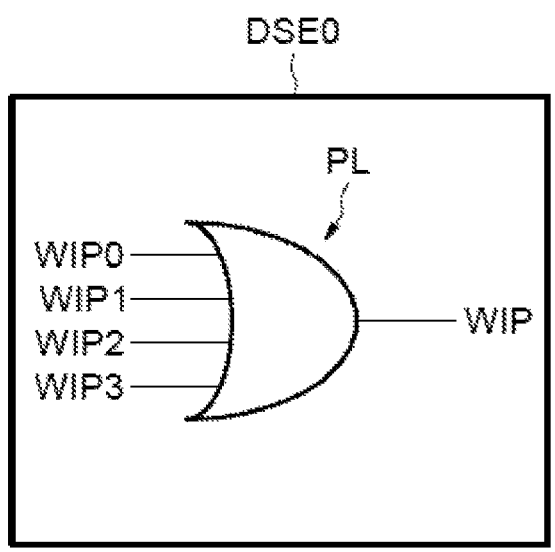
Figure 21:
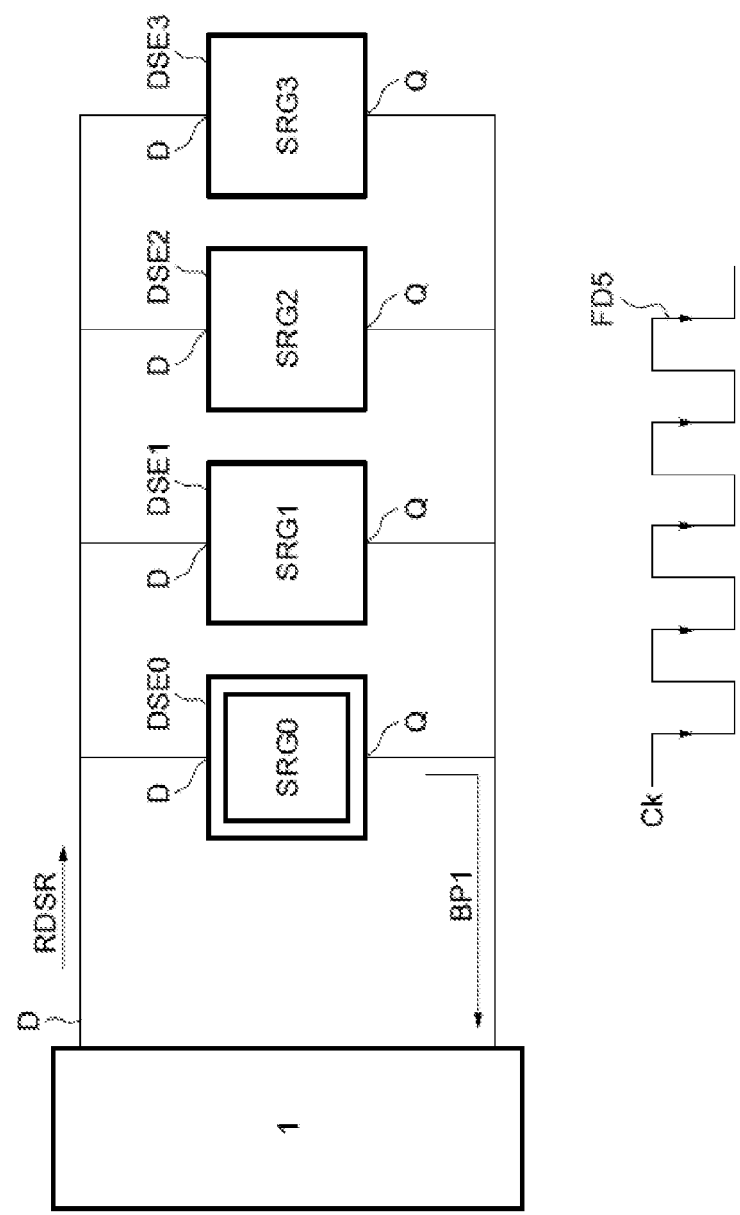
Figure 22:
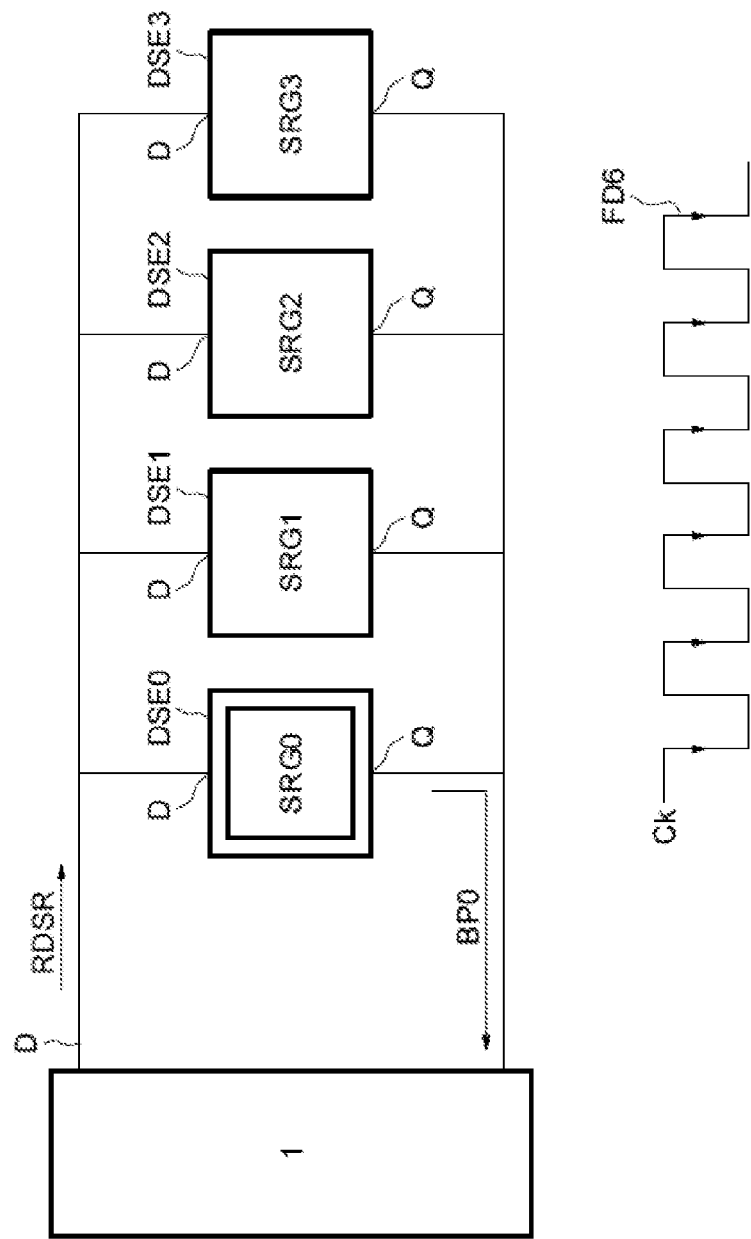

The individual memory device DSE0, which has stored the bits WIP0, WIP1, WIP2 and WIP3 in temporary registers, can then determine, using a logic gate PL, typically an OU logic gate, the bit WIP from these four bit values (FIG. 20).

The individual memory device DSE0 then delivers the bit BP1 on the falling edge FD5 of the clock signal CK (FIG. 21) then, the bit BP0 on the falling clock edge FD6 (FIG. 22), then the bit WEL (which is equal to the bit WEL0) on the falling edge FD7 (FIG. 23) and finally the bit WIP generated on the falling edge FD8 of the clock signal CK.

Just like a conventional memory device, eight falling clock edges are therefore required to transmit the eight bits of the status word MST, which therefore renders this operation transparent for the microcontroller 1.

It is also possible for the single memory device DSU to string a write command (WRITE) with an attempt to read the memory plane or an attempted write access to the memory plane or the virtual status register, that is to say to string commands WRITE and READ or else WRITE and WREN+WRITE or even WRITE and WREN+WRSR.

In this respect, two embodiments can be envisaged.

According to a first embodiment, during the write, the microcontroller is configured to read the bit WIP of the virtual status register by conducting looped reads of the virtual status register, and when the bit WIP drops back to 0, the single memory device DSU is considered to be ready to receive a next READ or WREN+WRITE or WREN+WRSR command.

According to a second embodiment, the fact that the maximum writing time (5 ms for example) is generally known is used. In this case, the microcontroller is configured to wait for a time equal to the maximum writing time after the signal S– has returned to the high state, and to then, without interrogating the bit WIP, initiate the next READ or WREN+WRITE, or WREN+WRSR command.

What is claimed is:

1. A non-volatile memory device, comprising:
a first memory chip having a plurality of non-volatile memory cells and a plurality of external connections, the external connections including a chip select input, a serial data input, a serial clock input and a serial data output; and
a second memory chip having a plurality of non-volatile memory cells and a plurality of external connections, the external connections including a chip select input coupled in parallel to the chip select input of the first memory chip, a serial data input coupled in parallel to the serial data input of the first memory chip, a serial clock input coupled in parallel to the serial clock input of the first memory chip, and a serial data output coupled in parallel to the serial data output of the first memory chip.

2. The device according to claim 1, wherein first and second memory chips each comprise an individual controller configured to have the memory access command executed or not as a function a content of the command.

3. The device according to claim 1, wherein first and second memory chips each comprise an individual status register configured to store an individual status word.

4. The device of claim 3, wherein the individual status word is the same for the first memory chip and the second memory chip.

5. The device of claim 3, wherein the first and second memory chips each comprise an individual write enable latch circuit having a first state in which it stores a first logic value corresponding to a write enable and a second state in which it stores a second value corresponding to a write disable.

6. The device of claim 1, wherein the first memory chip further includes means for determining whether or not to respond in response to a chip select signal received at the chip select input and the second memory chip further includes means for determining whether or not to respond in response to a chip select signal received at the chip select input.

7. The device of claim 1, wherein the first and second memory chips each include a respective write enable latch, the first memory chip storing a first value in the respective write enable latch and the second memory chip storing a second value in the respective write enable latch, the first value being different than the second value.

8. The device according to claim 1, wherein the first and second memory chips each have an individual memory capacity of 4 Mbits.

9. The device according to claim 1, further comprising:
a third memory chip having a plurality of non-volatile memory cells and a plurality of external connections, the external connections including a chip select input coupled to the chip select input of the first memory chip, a serial data input coupled to the serial data input of the first memory chip, a serial clock input coupled to the serial clock input of the first memory chip, and a serial data output coupled to the serial data output of the first memory chip; and
a fourth memory chip having a plurality of non-volatile memory cells and a plurality of external connections, the external connections including a chip select input coupled to the chip select input of the first memory chip, a serial data input coupled to the serial data input of the first memory chip, a serial clock input coupled to the serial clock input of the first memory chip, and a serial data output coupled to the serial data output of the first memory chip.

10. The device according to claim 1, wherein the first and second memory chips are encapsulated in a single package.

11. The device according to claim 10, wherein the first and second memory chips are stacked.

12. The device according to claim 1, wherein the first and second memory chips are EEPROM devices.

13. A non-volatile memory device, comprising:
a first memory chip having a plurality of non-volatile memory cells and a plurality of external connections, the external connections including a chip select input coupled to a common chip select line, a serial data input coupled to a common serial data input line, a serial clock input coupled to a common serial clock line and a serial data output coupled to a common serial data output line;
a second memory chip having a plurality of non-volatile memory cells and a plurality of external connections, the external connections including a chip select input coupled to the common chip select line, a serial data input coupled to the common serial data input line, a serial clock input coupled to the common serial clock line and a serial data output coupled to the common serial data output line;
a third memory chip having a plurality of non-volatile memory cells and a plurality of external connections, the external connections including a chip select input coupled to the common chip select line, a serial data input coupled to the common serial data input line, a serial clock input coupled to the common serial clock line and a serial data output coupled to the common serial data output line; and
a fourth memory chip having a plurality of non-volatile memory cells and a plurality of external connections, the external connections including a chip select input coupled to the common chip select line, a serial data input coupled to the common serial data input line, a serial clock input coupled to the common serial clock line and a serial data output coupled to the common serial data output line;
wherein the first, second, third and fourth memory chips are controllable so as to behave, as seen by a serial peripheral interface (SPI) bus, as a single non-volatile memory device.

14. The device according to claim 13, wherein the first, second, third and fourth memory chips each have an individual memory capacity of 4 Mbits and the non-volatile memory device has a memory capacity of 16 Mbits.

15. The device according to claim 13, wherein the first, second, third and fourth memory chips are stacked and encapsulated in a single package.

16. The device according to claim 13, wherein the first, second, third and fourth memory chips are EEPROM devices.

17. The device according to claim 13, wherein the first, second, third and fourth memory chips each include an associated individual controller which is configured to:
detect activation of a chip select signal on the common a chip select line;
place the associated memory chip in a selected state in response to the chip select signal;
receive a memory access command that is common to each of the first, second, third and fourth memory chips;
execute or not execute the memory access command as a function a content of the memory access command;
detect deactivation of the chip select signal on the common chip select line; and
place the associated memory chip in a deselected state in response to the detected deactivation.

18. The device according to claim 13, wherein the non-volatile memory device has a total memory space that is subdivided into four individual memory spaces respectively allocated to the first, second, third and fourth memory chips, and, in the presence of a memory access command and including an address of the total memory space, each memory chip is configured to determine whether it is affected or not by the memory access command.

19. The device according to claim 18, wherein each memory chip is configured to determine whether it is affected or not by the memory access command as a function of a content of at least a part of the address.

20. The device according to claim 18, wherein each memory chip is assigned an identifier corresponding to the individual memory space that is allocated to that memory chip.

21. A memory device, comprising:
an input/output interface;
a serial peripheral interface (SPI) bus coupled to the input/output interface; and
a plurality of individual electrically erasable programmable read-only memory (EEPROM) devices connected to the bus, each individual memory device having an individual memory space with an individual memory capacity, wherein chip select inputs of each individual memory device are all connected to one and the same chip select wire of the SPI bus;
wherein the individual memory devices are stacked and encapsulated in a single package;
wherein the individual memory devices are connected and controllable so as to behave, as seen by the input/output interface, as a single non-volatile memory device having a total memory space with a total memory capacity equal to the sum of the individual memory capacities of the individual devices; and
wherein the total memory space is subdivided into the plurality of individual memory spaces respectively allocated to the plurality of individual memory devices, and, in the presence of a memory access command and including an address of the total memory space, each memory chip is configured to determine whether it is affected or not by the memory access command.

* * * * *